(12) United States Patent
Kawaguchi et al.

(10) Patent No.: US 8,575,515 B2
(45) Date of Patent: Nov. 5, 2013

(54) LASER ANNEALING APPARATUS

(75) Inventors: Norihito Kawaguchi, Tokyo (JP); Ryusuke Kawakami, Tokyo (JP); Kenichiro Nishida, Tokyo (JP); Jun Izawa, Tokyo (JP); Miyuki Masaki, Tokyo (JP); Masaru Morita, Tokyo (JP)

(73) Assignee: IHI Corporation, Tokyo (JP)

( * ) Notice: Subject to any disclaimer, the term of this patent is extended or adjusted under 35 U.S.C. 154(b) by 251 days.

(21) Appl. No.: 13/002,010

(22) PCT Filed: Jun. 17, 2009

(86) PCT No.: PCT/JP2009/061016
§ 371 (c)(1),
(2), (4) Date: Dec. 29, 2010

(87) PCT Pub. No.: WO2010/001727
PCT Pub. Date: Jan. 7, 2010

(65) Prior Publication Data
US 2011/0108535 A1    May 12, 2011

(30) Foreign Application Priority Data
Jun. 30, 2008   (JP) .................................. 2008-170007

(51) Int. Cl.
*B23K 26/00* (2006.01)
*B23K 26/02* (2006.01)
*H01L 21/268* (2006.01)

(52) U.S. Cl.
USPC ................................ 219/121.86; 219/121.84

(58) Field of Classification Search
USPC ........ 117/200–202, 204, 904, 7–10; 438/166, 438/308, 473, 486, 487, 795–799, 482; 219/121.84, 121.63–121.72; 250/492.1–492.23; 427/554–556; 118/620, 641
See application file for complete search history.

(56) References Cited

U.S. PATENT DOCUMENTS

| 5,970,368 | A | 10/1999 | Sasaki et al. |
| 6,071,765 | A | 6/2000 | Noguchi et al. |

(Continued)

FOREIGN PATENT DOCUMENTS

| JP | 3-60015 A | 3/1991 |
| JP | 11176730 A | 7/1999 |

(Continued)

OTHER PUBLICATIONS

International Search Report issued in corresponding International Application No. PCT/JP2009/061016, completed Sep. 1, 2009, mailed Sep. 15, 2009.

(Continued)

*Primary Examiner* — Samuel M Heinrich
(74) *Attorney, Agent, or Firm* — Griffin & Szipl, P.C.

(57) ABSTRACT

A laser annealing apparatus is provided that is capable of reducing irradiation unevenness of laser light caused by a refraction phenomenon of the laser light due to fluctuation in the temperature of inert gas. The laser annealing apparatus includes a gas supply unit for supplying inert gas G to at least a laser irradiation area of a workpiece, and a gas temperature controller for regulating the temperature of the inert gas G. The gas temperature controller controls the temperature of the inert gas G supplied to the laser irradiation area so as to decrease a temperature difference between the temperature of the inert gas G and the atmospheric temperature of a space (a room R) that is disposed outside the supply area of the inert gas so the temperature controlled inert gas surrounds the optical path of the laser light.

8 Claims, 2 Drawing Sheets

(56) References Cited

U.S. PATENT DOCUMENTS

| | | |
|---|---|---|
| 6,733,931 B2 | 5/2004 | Voutsas et al. |
| 6,806,498 B2 | 10/2004 | Taketomi et al. |
| 6,818,568 B2 | 11/2004 | Tanaka |
| 7,078,322 B2 | 7/2006 | Tanada et al. |
| 7,105,048 B2 | 9/2006 | Yamazaki et al. |
| 7,304,005 B2 | 12/2007 | Yamazaki et al. |
| 7,326,295 B2 | 2/2008 | Park et al. |
| 7,560,397 B2 | 7/2009 | Yamazaki et al. |
| 7,585,714 B2 | 9/2009 | Yamazaki et al. |
| 7,714,251 B2 | 5/2010 | Miyairi |
| 7,723,167 B2 | 5/2010 | Tanaka |
| 8,153,928 B2 * | 4/2012 | Aubert et al. ............ 219/121.63 |
| 8,198,567 B2 * | 6/2012 | Lerner et al. .................. 219/390 |
| 2002/0096680 A1 | 7/2002 | Sugano et al. |
| 2003/0022471 A1 | 1/2003 | Taketomi et al. |
| 2003/0112322 A1 | 6/2003 | Tanaka |
| 2003/0175599 A1 | 9/2003 | Voutsas et al. |
| 2004/0053450 A1 | 3/2004 | Sposili et al. |
| 2005/0118751 A1 | 6/2005 | Yamazaki et al. |
| 2005/0181550 A1 | 8/2005 | Tanaka |
| 2007/0000428 A1 | 1/2007 | Yamazaki et al. |
| 2007/0008534 A1 | 1/2007 | Lo et al. |
| 2007/0010104 A1 | 1/2007 | Im et al. |
| 2007/0054478 A1 * | 3/2007 | Tsao ............................ 438/487 |
| 2007/0148925 A1 | 6/2007 | Yamazaki et al. |
| 2007/0184641 A1 | 8/2007 | Tanaka |
| 2008/0118203 A1 | 5/2008 | Tanaka |
| 2008/0204197 A1 | 8/2008 | Shionoiri |
| 2008/0251877 A1 | 10/2008 | Jain et al. |
| 2009/0045181 A1 | 2/2009 | Im |
| 2009/0191694 A1 | 7/2009 | Tanaka |
| 2009/0203230 A1 | 8/2009 | Park |
| 2009/0218577 A1 | 9/2009 | Im |
| 2009/0305483 A1 | 12/2009 | Tanaka |
| 2010/0323504 A1 | 12/2010 | Tanaka et al. |
| 2011/0003484 A1 | 1/2011 | Kim et al. |
| 2011/0097906 A1 | 4/2011 | Kwon et al. |
| 2011/0104908 A1 | 5/2011 | You |
| 2011/0186854 A1 | 8/2011 | Im |

FOREIGN PATENT DOCUMENTS

| | | | |
|---|---|---|---|
| JP | 200084686 A | | 3/2000 |
| JP | 3091904 B2 | | 9/2000 |
| JP | 2003142395 A | | 5/2003 |
| JP | 2004087962 A | | 3/2004 |
| JP | 3735394 B2 | | 1/2006 |
| JP | 2006253285 A | | 9/2006 |
| JP | 2007288128 A | | 11/2007 |
| KR | 10-2004-0031276 | | 4/2004 |
| KR | 2004031276 A | * | 4/2004 |
| KR | 20070071082 A | | 7/2007 |
| TW | 200507094 A | | 2/2005 |
| TW | 200824829 A | | 6/2008 |
| WO | 2006/022196 A1 | | 3/2006 |

OTHER PUBLICATIONS

Office Action issued on Nov. 21, 2011 in corresponding Taiwanese Patent Application No. 98120374.

Office Action issued on Nov. 22, 2011 in corresponding Korean Patent Application No. 10-2010-702718.

Extended European Search Report issued in EP Application No. 09770083.5, completed Jun. 30, 2011 and mailed on Jul. 6, 2011.

"Peltier—Thermoelectric Cooler Modules," at http://www.tetech.com/Peltier-Thermoelectric-Cooler-Modules.html (2010).

"Aligner—definition of aligner by the Free Online Dictionary," at http://www.thefreedictionary.com/p/aligner (2013).

Espacenet—Bibliographic data corresponding to KR20040031276 (A), last updated Dec. 19, 2012, which corresponds to Exhibit B.

Espacenet—Bibliographic data corresponding to JP 11-176730 (A), downloaded Dec. 29, 2010, which corresponds to Exhibit C.

* cited by examiner

LASER ANNEALING APPARATUS

This is a National Phase Application in the United States of International Patent Application No. PCT/JP2009/061016 filed Jun. 17, 2009, which claims priority on Japanese Patent Application No. 2008-170007, filed Jun. 30, 2008. The entire disclosures of the above patent applications are hereby incorporated by reference.

BACKGROUND OF THE INVENTION

1. Technical Field of the Invention

The present invention relates to a laser annealing apparatus for performing an annealing treatment on a workpiece to be processed by irradiating the workpiece with laser light.

2. Description of the Related Art

In recent years, a thin film transistor (TFT) in which a polysilicon film is used for a channel layer has been widely used as a switching element of a semiconductor device and a liquid crystal display. The polysilicon film used for the channel layer of the thin film transistor is generally manufactured using a process called a low-temperature polysilicon. The low-temperature polysilicon is a process of forming an amorphous silicon film on a glass substrate and irradiating the amorphous silicon film with a laser light to produce a polysilicon film.

In such a low-temperature polysilicon, the amorphous silicon film is heated, melted, and recrystallized to produce a polysilicon film using a laser annealing apparatus. However, the low-temperature polysilicon has a problem in that if oxygen is included in the annealing atmosphere, the silicon is oxidized during heating to have an adverse effect on the device characteristics. For this reason, an operation of preventing oxidation of silicon using an inert gas such as nitrogen is performed.

In Patent Document 1, a stage on which a glass substrate is placed is provided in a processing chamber so as to supply nitrogen gas into the processing chamber, thus preventing oxidation of silicon during an annealing treatment.

In Patent Document 2, nitrogen is discharged from a tip end of a swing nozzle that swings up and down so as to create a nitrogen atmosphere only in the vicinity of a laser irradiation portion, thus preventing oxidation of silicon during an annealing treatment.

In Patent Document 3, in a state in which a cylindrical cell of which the top portion is sealed by glass and the bottom portion is open is disposed at a position sufficiently close to a substrate, nitrogen gas is filled into the cell, thus preventing oxidation of silicon during annealing.

[Patent Document 1] Japanese Patent No. 3735394
[Patent Document 2] Japanese Patent No. 3091904
[Patent Document 3] Japanese Unexamined Patent Application Publication No. 2004-87962

When the laser annealing using the supply of nitrogen as described above is performed, due to a difference in the flow rate of the nitrogen gas and variation in the ambient air temperature resulting from the change of seasons or the like, a problem that the process becomes unstable occurs, such as the occurrence of irradiation unevenness.

The present inventors have carried out intensive investigations into the cause of the occurrence of such irradiation unevenness and found that a refraction phenomenon of laser light resulting from fluctuation (variation) in the temperature of the nitrogen gas was the cause. In Japanese Unexamined Patent Application Publication No. H11-176730, it is described in regard to a laser interference length measuring machine that variation in the refractive indices of air has an influence on the precision of an optical sensor, which supports the idea of the present inventors.

SUMMARY OF THE INVENTION

The present invention has been made in consideration of the above-mentioned problems, and an object of the present invention is to provide a laser annealing apparatus capable of reducing irradiation unevenness of laser light caused by a refraction phenomenon of laser light due to fluctuation (variation) in the temperature of inert gas.

To achieve the above object, the laser annealing apparatus of the present invention apply the following means.

(1) A laser annealing apparatus that performs an annealing treatment on a workpiece to be processed by irradiating the workpiece with a laser light, characterized in that the apparatus includes a gas supply unit that supplies an inert gas to at least a laser irradiation area of the workpiece, and a gas temperature controller that controls the temperature of the inert gas, and the gas temperature controller controls the temperature of the inert gas supplied to the laser irradiation area so as to decrease the temperature difference between the temperature of the inert gas and the atmospheric temperature of a space that is disposed outside the supply area of the inert gas so as to surround an optical path of the laser light.

According to the configuration of the present invention, the temperature of the inert gas supplied to the laser irradiation area is controlled by the gas temperature controller so as to approach the atmospheric temperature of a space (room) that is disposed outside the supply area of the inert gas so as to surround the optical path of the laser light. With this configuration, since the temperature difference between the room and the inert gas decreases, the refraction phenomenon of the laser light is decreased, whereby irradiation unevenness is reduced. The temperature difference between the room and the inert gas is preferably as low as possible and is most preferably zero.

(2) The gas supply unit includes a purge box which is disposed so as to face the surface of the workpiece and in which the inert gas is introduced, the purge box includes a transmission window that transmits the laser light so as to be introduced therein and an opening that passes the introduced laser light therethrough and blows the inside inert gas towards the workpiece, and the gas temperature controller controls the temperature of the inert gas at a position located further upstream than the purge box.

According to the configuration of the present invention, since the purge box is disposed on the optical path of the laser light, although the laser light passes through the inert gas in the purge box during the annealing treatment, the temperature of the inert gas is controlled so as to approach the atmospheric temperature (temperature of the room) outside the purge box before the inert gas is introduced into the purge box. Therefore, a refraction phenomenon of the laser light in the purge box is decreased, whereby irradiation unevenness is reduced.

(3) The gas supply unit includes a parallel facing body that is disposed so as to face the surface of the workpiece in parallel and a purge unit that sprays the inert gas towards the workpiece so that the inert gas is supplied between the parallel facing body and the surface of the workpiece, and the gas temperature controller controls the temperature of the inert gas at a position that is located within the purge unit or located further upstream than the purge unit.

According to the configuration, although the inert gas is sprayed from the purge unit towards the workpiece during the annealing treatment, and the laser light passes through the inert gas, the temperature of the inert gas is controlled so as to approach the atmospheric temperature of the space outside the purge unit before the inert gas is sprayed towards the workpiece. Therefore, a refraction phenomenon of the laser light in the supply area of the inert gas is decreased, whereby irradiation unevenness is reduced.

(4) The gas supply unit includes a processing chamber which accommodates the workpiece and in which the inert gas is introduced, and the gas temperature controller controls the temperature of the inert gas at a position located further upstream than the processing chamber.

According to the configuration, although during the annealing treatment, the laser light passes through the inert gas inside the processing chamber, the temperature of the inert gas is controlled so as to approach the atmospheric temperature outside the processing chamber before the inert gas is introduced into the processing chamber. Therefore, a refraction phenomenon of the laser light in the processing chamber is decreased, whereby irradiation unevenness is reduced.

According to the present invention, it is possible to reduce irradiation unevenness of laser light caused by a refraction phenomenon of laser light due to fluctuation (variation) in the temperature of inert gas.

DESCRIPTION OF THE PREFERRED EMBODIMENT

Figure 1:
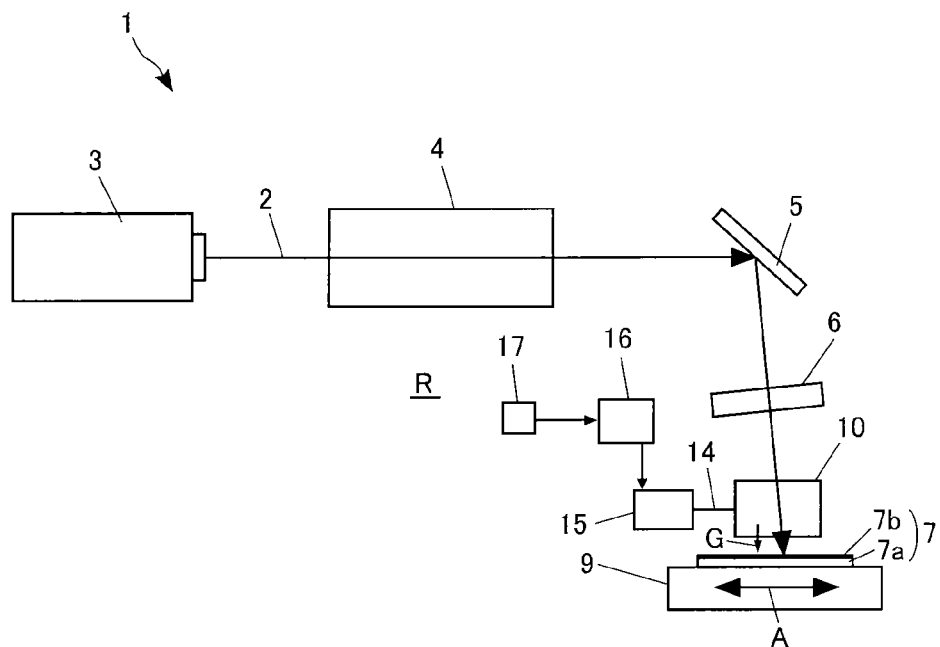
FIG. 1 is a diagram illustrating an entire configuration of a laser annealing apparatus according to an embodiment of the present invention.

Preferred embodiments of the present invention will be described below in detail with reference to the accompanying drawings. The same reference numerals are given to common portions in each of the drawings to avoid redundant description.

FIG. 1 is a diagram illustrating an entire configuration of a laser annealing apparatus 1 according to an embodiment of the present invention. The laser annealing apparatus 1 includes, as its basic constituent elements, a laser light source 3 that emits laser light 2, a beam shaping optical system 4 that shapes the laser light 2 from the laser light source 3 into a desired beam shape, a reflecting mirror 5 that reflects the laser light 2 towards a workpiece to be processed 7, a condensing lens 6 that condenses the laser light 2 from the reflecting mirror 5 onto the surface of the workpiece 7, and a movable stage 9 that moves in a direction (direction indicated by arrow A in the figure) crossing the laser light 2 while carrying the workpiece 7.

As the laser light source 3, an excimer laser, a solid-state laser, or a semiconductor laser can be used, for example. As examples of the solid-state laser, YAG, YLF, $YVO_4$, and the like can be used. The laser light 2 may be either pulse oscillated or continuously oscillated.

The beam shaping optical system 4 can be configured to shape the laser light 2 so as to have a linear or rectangular beam in sectional view on the surface of the workpiece 7, and in this case, can include a beam expander, a homogenizer, and the like as its constituent elements.

The workpiece 7 includes a substrate 7a and an amorphous semiconductor film 7b formed thereon. The substrate 7a is a glass substrate or a semiconductor substrate. The amorphous semiconductor film 7b is an amorphous silicon film, for example.

With the laser annealing apparatus 1 configured as above, the laser light 2 is emitted from the laser light source 3, and the laser light 2 is condensed into a linear or rectangular beam by the beam shaping by the beam shaping optical system 4 and the condensing by the condensing lens 6 and irradiated onto the workpiece 7. In this state, the workpiece 7 is moved in the short-axis direction of the beam by the movable stage 9 so as to scan over the entire surface of the amorphous semiconductor film of the workpiece 7 at the laser irradiation portion. In this way, the amorphous semiconductor film 7b is crystallized. For example, the amorphous silicon film is changed to a polysilicon film.

The beam shape of the laser light 2 irradiated onto the workpiece 7 is not limited to the linear or rectangular beam, and it is possible to effectively perform an annealing treatment on the workpiece 7 having a large area by scanning the laser light 2 condensed into a linear or rectangular beam in the short-axis direction thereof.

The laser annealing apparatus 1 of the present invention further includes a gas supply unit 10 that supplies an inert gas G to at least a laser irradiation area of the workpiece 7 and a gas temperature controller 15 that controls the temperature of the inert gas G.

As the inert gas G supplied from the gas supply unit 10, nitrogen, helium, neon, argon, krypton, xenon, radon, unu-noctium, and the like can be used. The inert gas G is introduced to the gas supply unit 10 through a gas pipe 14 from a gas tank or a gas cylinder which is provided outside a room R in which the laser annealing apparatus 1 is provided. For this reason, the temperature of the inert gas G is generally different from the temperature of the room R.

The gas temperature controller 15 controls the temperature of the inert gas G supplied to the laser irradiation area so as to decrease the temperature difference between the temperature of the inert gas G and the atmospheric temperature of a space that is disposed outside the supply area of the inert gas G so as to surround the optical path of the laser light 2. The gas temperature controller 15 preferably has a function of both heating and cooling the inert gas G.

Here, the space that is disposed outside the inert gas G so as to surround the optical path of the laser light 2 is generally the room R (for example, a cleanroom) in which the laser annealing apparatus 1 is provided, and the temperature thereof is the inside temperature of the room R. The temperature of the room R is detected by a temperature sensor 17 provided in the room R.

The temperature detected by the temperature sensor 17 is converted into a temperature signal and transmitted to a control unit 16. The control unit 16 controls the gas temperature controller 15 so that the temperature of the inert gas G approaches the temperature of the room R.

According to the above-described configuration of the present invention, the temperature of the inert gas G supplied to the laser irradiation area is controlled by the gas temperature controller 15 so as to approach the atmospheric temperature of the space (room R) that is disposed outside the supply area of the inert gas G so as to surround the optical path of the laser light 2.

For example, when the temperature of the room R is relatively low by an air conditioner, and the temperature of the inert gas G supplied from a gas tank provided at a different place is relatively high, the inert gas G is cooled by the gas temperature controller. Moreover, for example, when the temperature of the room R is relatively high by an air conditioner, and the temperature of the inert gas G supplied from a gas tank provided at a different place is relatively low, the inert gas G is heated by the gas temperature controller.

In this way, since the temperature difference between the room R and the inert gas G is decreased, a refraction phenomenon of the laser light 2 is decreased, whereby irradiation unevenness is reduced. The temperature difference between the room R and the inert gas G is preferably as low as possible and is most preferably zero. Therefore, it is preferable to control the temperature of the inert gas G so as to be the same as the temperature of the room R with the gas temperature controller 15.

The gas supply unit 10 may employ various forms as long as it has a function of supplying the inert gas G to at least the laser irradiation area of the workpiece 7. Hereinafter, several configuration examples of the gas supply unit 10 will be described, and the present invention is not limited to these configuration examples.

Figure 2:
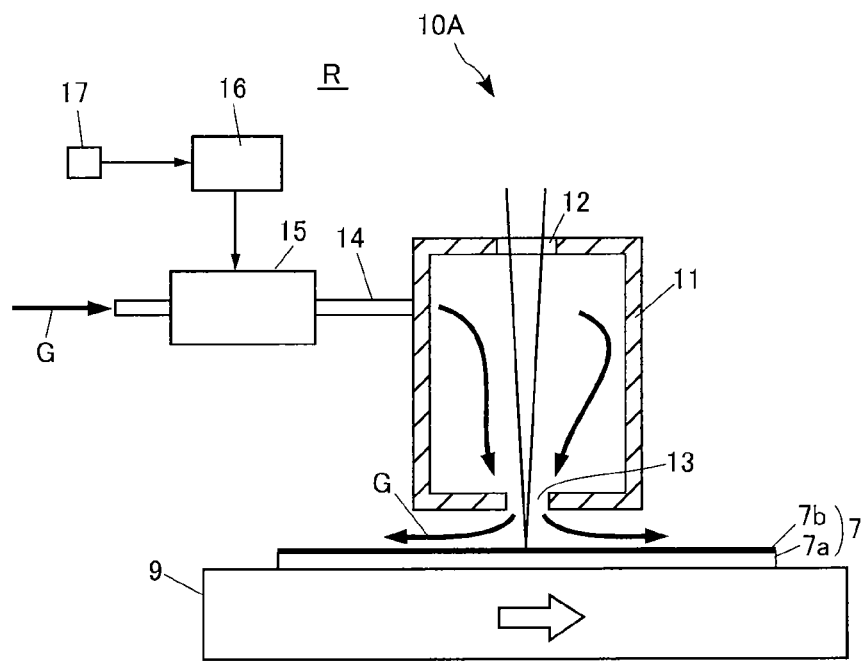
FIG. 2 is a diagram illustrating a first configuration example of a gas supply unit in the laser annealing apparatus according to the embodiment of the present invention.

FIG. 2 is a diagram illustrating a gas supply unit 10A according to a first configuration example. In FIG. 2, the gas supply unit 10A includes a purge box 11 of which the lower surface in the figure is disposed so as to face the surface of the workpiece 7 and in which the inert gas G is introduced. The purge box 11 includes a transmission window 12 (for example, a glass window) that transmits the laser light 2 so as to be introduced therein and an opening 13 that passes the introduced laser light 2 therethrough and blows the inside inert gas G towards the workpiece 7.

With this configuration, a purge area is formed by the inert gas G between the lower surface of the purge box 11 and the workpiece 7. For this reason, the lower surface of the purge box 11 is preferably a flat surface that is parallel to the surface of the workpiece 7, and the distance between the lower surface of the purge box 11 and the workpiece 7 is preferably sufficiently small (for example, within 5 mm) within a range where they do not come into contact.

The gas temperature controller 15 controls the temperature of the inert gas G at a position located further upstream than the purge box 11. In FIG. 2, the purge box 11 is connected to a gas pipe 14 for introducing the inert gas G into the purge box 11, and the gas temperature controller 15 is provided in the way of the gas pipe 14.

As the gas temperature controller 15, for example, heat pumping heating-cooling equipment and electronic heating-cooling equipment using a Peltier device can be used. When the gas temperature controller 15 is configured as heating equipment only, it may be configured by a ribbon heater and a heating furnace. In this regard, the same statements can be applied to the second and third configuration examples.

In the first configuration example, since the purge box 11 is disposed on the optical path of the laser light 2, although the laser light 2 passes through the inert gas G in the purge box 11 during the annealing treatment, the temperature of the inert gas G is controlled so as to approach the atmospheric temperature (temperature of the room R) outside the purge box 11 before the inert gas G is introduced into the purge box 11. Therefore, the difference between the atmospheric temperature of the space surrounding the optical path of the laser light 2 and the temperature of the inert gas G inside the purge box 11 and in the purge area decreases, and a refraction phenomenon of the laser light 2 in the purge box 11 is decreased, whereby irradiation unevenness is reduced.

Figure 3:
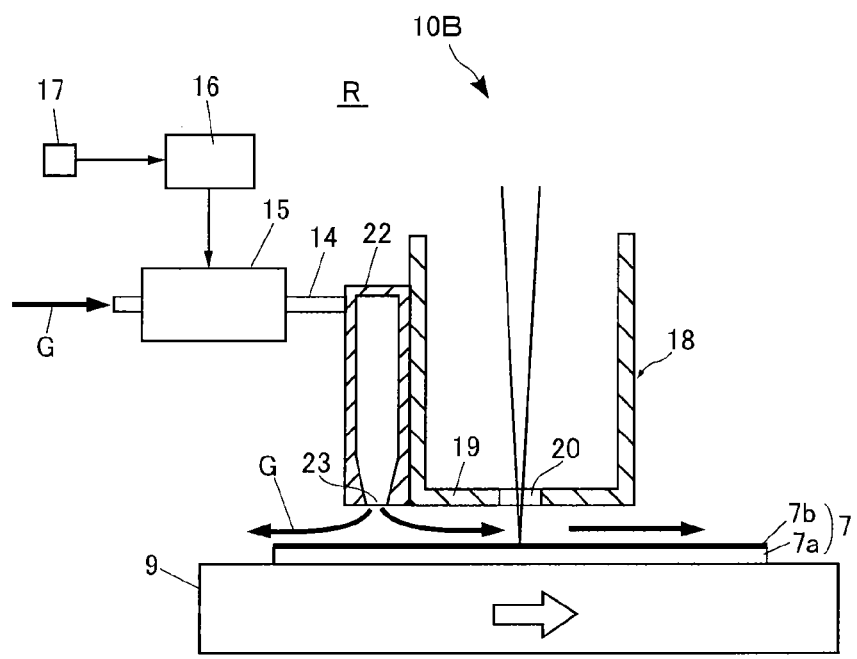
FIG. 3 is a diagram illustrating a second configuration example of a gas supply unit in the laser annealing apparatus according to the embodiment of the present invention.

FIG. 3 shows a gas supply unit 10B according to a second configuration example. In FIG. 3, the gas supply unit 10B includes a parallel facing body 18 of which the lower surface in the figure is disposed so as to face the surface of the workpiece 7 in parallel and a purge unit 22 that sprays the inert gas G towards the workpiece 7 so that the inert gas G is supplied between the parallel facing body 18 and the surface of the workpiece 7.

With this configuration, a purge area is formed by the inert gas G between the lower surface of the parallel facing body 18 and the workpiece 7. For this reason, the lower surface of the parallel facing body 18 is preferably a flat surface that is parallel to the surface of the workpiece 7, and the distance between the lower surface of the parallel facing body 18 and the workpiece 7 is preferably sufficiently small (for example, within 5 mm) within a range where they do not come into contact. Moreover, in the configuration example of FIG. 3, the parallel facing body 18 includes a transmission window 20 (for example, a glass window) which is formed on a bottom portion 19 that forms the lower surface facing the workpiece 7 so as to transmit the laser light 2.

The purge unit 22 has a void structure in which the inert gas G is introduced and has a discharge opening 23 which is formed on the bottom portion thereof so as to blow the inert gas G towards the workpiece 7. In the configuration example of FIG. 3, the purge unit 22 is mounted on the side portion of the parallel facing body 18.

In the configuration example of FIG. 3, the gas temperature controller 15 controls the temperature of the inert gas G at a position located further upstream than the purge unit 22. The purge unit 22 is connected to a gas pipe 14 for introducing the inert gas G into the purge unit 22, and the gas temperature controller 15 is provided in the way of the gas pipe 14. Alternatively, instead of this configuration, the gas temperature controller may be provided inside the purge unit 22 so as to heat or cool the inert gas G inside the purge unit 22.

In the second configuration example, although the inert gas G is sprayed from the purge unit 22 towards the workpiece 7 during the annealing treatment, and the laser light 2 passes through the inert gas G, the temperature of the inert gas G is controlled so as to approach the atmospheric temperature of the space (a room R) outside the purge unit 22 before the inert gas G is sprayed towards the workpiece 7. Therefore, the difference between the atmospheric temperature of the space surrounding the optical path of the laser light 2 and the temperature of the inert gas G in the purge area decreases, and a refraction phenomenon of the laser light 2 in the supply area of the inert gas G is decreased, whereby irradiation unevenness is reduced.

Figure 4:
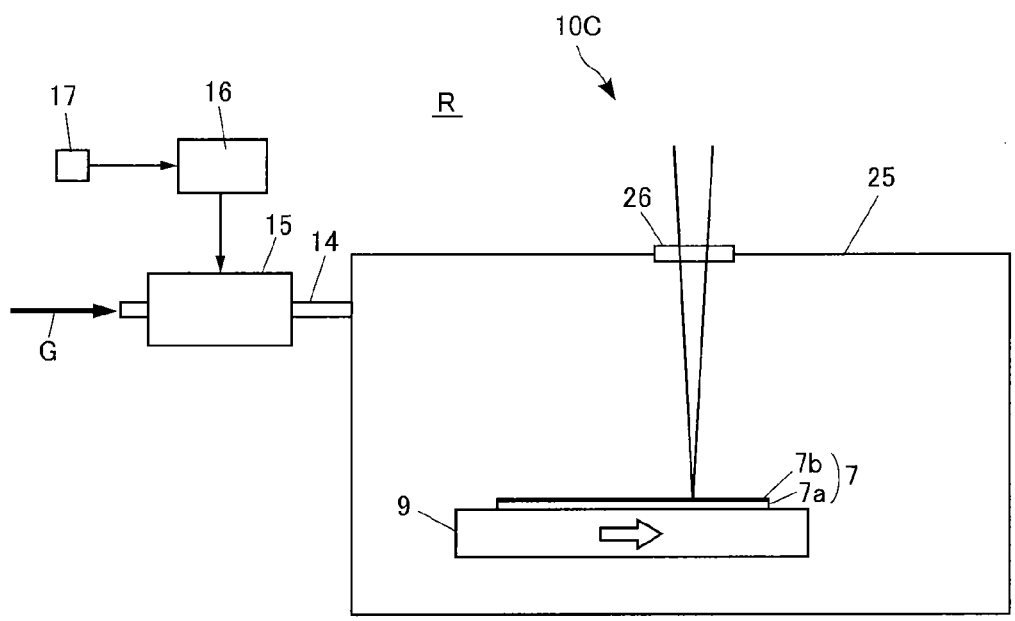
FIG. 4 is a diagram illustrating a third configuration example of a gas supply unit in the laser annealing apparatus according to the embodiment of the present invention.

FIG. 4 shows a gas supply unit 10C according to a third configuration example. In FIG. 4, the gas supply unit 10C includes a processing chamber 25 which accommodates the workpiece 7 therein and in which the inert gas G is introduced. The processing chamber 25 is connected to an exhaust unit (not shown) for exhausting inside gas.

In the processing chamber 25, a movable stage 9 is provided therein, and a transmission window 26 (for example, a glass window) is provided on the top portion thereof so as to transmit the laser light 2 therethrough. Thus, the laser light 2 can be introduced into the processing chamber 25 through the transmission window 26 and irradiated onto the workpiece 7.

The gas temperature controller 15 controls the temperature of the inert gas G at a position located further upstream than the processing chamber 25. The processing chamber 25 is connected to a gas pipe 14 for introducing the inert gas G into the processing chamber 25, and the gas temperature controller 15 is provided in the way of the gas pipe 14.

In the third configuration example, by exhausting air inside the processing chamber 25 and introducing the inert gas G into the processing chamber 25, the inside of the processing chamber 25 is filled with the inert gas G. Although during the annealing treatment, the laser light 2 passes through the inert gas G inside the processing chamber 25, the temperature of the inert gas G is controlled so as to approach the atmospheric temperature of the space (a room R) outside the processing chamber 25 before the inert gas G is introduced into the processing chamber 25. Therefore, the difference between the atmospheric temperature of the space surrounding the optical path of the laser light 2 and the temperature of the inert gas G in the purge area decreases, and a refraction phenomenon of the laser light 2 in the processing chamber 25 is decreased, whereby irradiation unevenness is reduced.

While preferred embodiments of the present invention have been described and shown above, the disclosed embodiments have been provided for the purpose of illustration but the present invention is not limited to the disclosed embodiments. The scope of the invention is defined as set forth in the appended claims and is intended to encompass all modifications, changes and alterations which fall within the appended claims or the equivalents thereof.

The invention claimed is:

1. A laser annealing apparatus that performs an annealing treatment on a workpiece to be processed by irradiating the workpiece with laser light, wherein apparatus comprises:
 (a) a gas supply unit that supplies an inert gas to at least a laser irradiation area of a workpiece, wherein the gas supply unit includes a purge box that has a bottom surface that is a flat surface parallel to a surface of the workpiece, wherein the bottom surface of the purge box is disposed so as to face the surface of the workpiece and the inert gas is introduced into the purge box;
 (b) a laser light source that emits laser light; and
 (c) a gas temperature controller that controls the temperature of the inert gas in a supply area, wherein the purge box includes
  i. a transmission window that transmits the laser light so the laser light is introduced into the purge box; and
  ii. an opening provided in the bottom surface of the purge box that passes the laser light introduced into the purge box through the purge box and the inert gas inside the purge box blows through the opening towards the workpiece, and
 wherein the inert gas blowing through the opening of the purge box forms a purge area between the bottom surface of the purge box and the surface of the workpiece, and the gas temperature controller controls the temperature of the inert gas supplied to the laser irradiation area of the workpiece so as to decrease a temperature difference between the temperature of the inert gas and an atmospheric temperature of a space disposed outside the supply area of the inert gas so as to surround an optical path of the laser light with the temperature controlled inert gas.

2. The laser annealing apparatus according to claim 1, wherein the gas temperature controller controls the temperature of the inert gas at a position located further upstream than the purge box.

3. The laser annealing apparatus according to claim 1, wherein the gas temperature controller comprises heat pumping heating-cooling equipment or electronic heating-cooling equipment that includes a Peltier device.

4. The laser annealing apparatus according to claim 1, wherein the gas temperature controller comprises only heating equipment including a ribbon heater and a heating furnace.

5. A laser annealing apparatus that performs an annealing treatment on a workpiece to be processed by irradiating the workpiece with laser light, wherein the apparatus comprises:
 (a) a gas supply unit that supplies an inert gas to at least a laser irradiation area of a workpiece, wherein the gas supply unit includes
  i. a parallel facing body having a bottom surface that is parallel to a surface of the workpiece, wherein the parallel facing body includes a transmission window that is formed on a bottom portion of the parallel facing body, wherein the bottom surface of the parallel facing body includes the bottom portion, and the bottom surface faces the workpiece so laser light is transmitted through the transmission window to the laser irradiation area of the workpiece; and
  ii. a purge unit disposed on an upstream side of the parallel facing body, wherein the purge unit is disposed to spray the inert gas towards the workpiece so that the inert gas is supplied between the parallel facing body and the surface of the workpiece, and so the inert gas flows one way between the parallel facing body and the workpiece;
 (b) a laser light source that emits the laser light; and
 (c) a gas temperature controller that controls temperature of the inert gas in a supply area, wherein the inert gas blows through a discharge opening formed on a bottom portion of the purge unit to a purge area between a bottom surface of the parallel facing body and the surface of the workpiece, and the gas temperature controller controls a temperature of the inert gas supplied to the laser irradiation area of the workpiece so as to decrease a temperature difference between the temperature of the inert gas and an atmospheric temperature of a space disposed outside the supply area of the inert gas so as to surround an optical path of the laser light with the temperature controlled inert gas.

6. The laser annealing apparatus according to claim 5, wherein the gas temperature controller controls the temperature of the inert gas at a position that is located within the purge unit or that is located further upstream than the purge unit.

7. The laser annealing apparatus according to claim 5, wherein the gas temperature controller comprises heat pumping heating-cooling equipment or electronic heating-cooling equipment that includes a Peltier device.

8. The laser annealing apparatus according to claim 5, wherein the gas temperature controller comprises only heating equipment including a ribbon heater and a heating furnace.

* * * * *